United States Patent
Zhang et al.

(10) Patent No.: US 10,886,482 B2
(45) Date of Patent: Jan. 5, 2021

(54) DISPLAY DEVICE HAVING STRESS BUFFER LAYERED VIAS

(71) Applicant: BOE Technology Group Co., Ltd., Beijing (CN)

(72) Inventors: Shuai Zhang, Beijing (CN); Xiaolong Li, Beijing (CN); Yueping Zuo, Beijing (CN); Shantao Chen, Beijing (CN); Qiuhua Meng, Beijing (CN); Ming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/452,946

(22) Filed: Jun. 26, 2019

(65) Prior Publication Data

US 2020/0106031 A1 Apr. 2, 2020

(30) Foreign Application Priority Data

Sep. 28, 2018 (CN) .......................... 2018 1 1142468

(51) Int. Cl.
*H01L 51/00* (2006.01)
*H01L 51/52* (2006.01)
(Continued)

(52) U.S. Cl.
CPC .......... *H01L 51/0097* (2013.01); *C08L 63/00* (2013.01); *G03F 7/0002* (2013.01); (Continued)

(58) Field of Classification Search
CPC ............. H01L 51/0097; H01L 51/5253; H01L 27/323; H01L 27/3244; H01L 33/12;
(Continued)

(56) References Cited

U.S. PATENT DOCUMENTS 5,672,543 A * 9/1997 Chang ............... H01L 21/76843
438/653
5,923,963 A * 7/1999 Yamanaka ............ G02F 1/1362
438/157

(Continued)

FOREIGN PATENT DOCUMENTS

CN 203521429 4/2014
CN 103928399 7/2014
(Continued)

OTHER PUBLICATIONS

Office Action from Chinese Patent Application No. 201811142468.9, dated Mar. 16, 2020, 13 pgs.

*Primary Examiner* — Ida M Soward
(74) *Attorney, Agent, or Firm* — Westman, Champlin & Koehler, P.A.

(57) ABSTRACT

A flexible display panel, a manufacturing method thereof and a display device are provided. The flexible display panel includes: a flexible substrate, a first metal layer formed on the substrate, an insulation layer overlying the first metal layer, and a second metal layer disposed on the insulation layer, wherein a plurality of via holes are provided in the insulation layer, the inner wall of each via hole is covered by a stress buffer layer and the second metal layer is formed on the stress buffer layer and connected to the first metal layer through the via holes.

16 Claims, 3 Drawing Sheets

(51) Int. Cl.
| | |
|---|---|
| *H01L 27/32* | (2006.01) |
| *H01L 33/12* | (2010.01) |
| *H01L 29/78* | (2006.01) |
| *C08L 63/00* | (2006.01) |
| *G03F 7/00* | (2006.01) |
| *H05K 1/02* | (2006.01) |
| *B82Y 10/00* | (2011.01) |
| *B82Y 40/00* | (2011.01) |

(52) U.S. Cl.
CPC ........ *H01L 27/323* (2013.01); *H01L 27/3244* (2013.01); *H01L 51/5253* (2013.01); *H05K 1/028* (2013.01); *B82Y 10/00* (2013.01); *B82Y 40/00* (2013.01); *H01L 29/7843* (2013.01); *H01L 33/12* (2013.01); *H01L 2251/5338* (2013.01); *H01L 2251/566* (2013.01); *H05K 2201/10128* (2013.01)

(58) Field of Classification Search
CPC .... H01L 29/7843; C08L 63/00; G03F 7/0002; H05K 1/028
See application file for complete search history.

(56) References Cited

U.S. PATENT DOCUMENTS

| | | | | |
|---|---|---|---|---|
| 6,518,170 | B2* | 2/2003 | Koganei | H01L 21/312 438/623 |
| 7,402,515 | B2* | 7/2008 | Arana | H01L 21/76898 257/774 |
| 7,651,906 | B2* | 1/2010 | Park | H01L 27/24 438/237 |
| 7,863,747 | B2* | 1/2011 | Lee | H01L 21/76898 257/758 |
| 7,998,851 | B2* | 8/2011 | Son | H01L 27/0688 438/607 |
| 8,450,206 | B2* | 5/2013 | Walter | H01L 23/5283 438/637 |
| 8,803,316 | B2* | 8/2014 | Lin | H01L 21/76898 257/737 |
| 9,111,914 | B2* | 8/2015 | Lin | H01L 21/486 |
| 9,159,699 | B2* | 10/2015 | Tsai | H01L 25/50 |
| 9,177,856 | B2* | 11/2015 | Horii | H01L 21/046 |
| 9,337,118 | B2* | 5/2016 | Wang | H01L 23/3171 |
| 9,520,320 | B2 | 12/2016 | Wu | |
| 9,978,777 | B2* | 5/2018 | Seo | H01L 29/66969 |
| 10,037,897 | B2* | 7/2018 | Kuo | H01L 21/481 |
| 10,101,620 | B2* | 10/2018 | Deng | H01L 21/77 |
| 10,128,168 | B2* | 11/2018 | Choi | H01L 23/481 |
| 10,209,587 | B2* | 2/2019 | Wu | G02F 1/136227 |
| 10,658,403 | B2* | 5/2020 | Liu | H01L 29/42384 |
| 2008/0197342 | A1* | 8/2008 | Lee | H01L 51/56 257/40 |
| 2011/0204517 | A1* | 8/2011 | Gu | H01L 23/481 257/751 |
| 2015/0187640 | A1 | 7/2015 | Wu | |

FOREIGN PATENT DOCUMENTS

| | | |
|---|---|---|
| CN | 107167865 | 9/2017 |
| CN | 108321160 | 7/2018 |

\* cited by examiner

DISPLAY DEVICE HAVING STRESS BUFFER LAYERED VIAS

CROSS-REFERENCE TO RELATED APPLICATION

The present claims the priority benefits of China Patent Application No. 201811142468.9, filed on Sep. 28, 2018, the entirety of which is hereby incorporated by reference herein.

TECHNICAL FIELD

The present disclosure relates to the field of display technology, in particular to a flexible display panel, a manufacturing method thereof and a display device.

BACKGROUND

While a thinner overall structure of the display products is being pursued in the industry, more and more flexible bendable display products such as Organic Light-Emitting Diode (OLED) display can be found in the market. In existing flexible bendable display products, an insulation layer (usually an inorganic insulation layer) resides between metal layers, and an electric connection between the upper and lower metal layers is achieved through via holes in the insulation layer. With this kind of stake-up configuration of the metal layers and the insulation layer, if the insulation layer fractures during bending, the stress-concentration-induced crack would propagate to the metal layers and directly lead to breakage of the metal layers, thereby giving rise to defective display product.

SUMMARY

In one aspect, an embodiment of the present disclosure provides a flexible display panel, comprising:
a first metal layer;
an insulation layer overlying the first metal layer; and
a second metal layer disposed on the insulation layer,
wherein, a plurality of via holes are provided in the insulation layer, an inner wall of each via hole is covered by a stress buffer layer, and the second metal layer is formed on the stress buffer layer and electrically connected to the first metal layer by the via holes.

Optionally, the stress buffer layer also occupies a region on the insulation layer that covers an edge of an opening of each via hole.

Optionally, the stress buffer layer is made of a resin material.

Optionally, the resin material comprises at least one of polymethyl methacrylate, acrylic ester, vinyl ether and epoxy resin.

Optionally, the stress buffer layer has a thickness ranging from 5 nm to 10 nm.

Optionally, the stress buffer layer is a nanoimprinted buffer layer formed by nanoimprint lithography.

Optionally, a thickness of the stress buffer layer at the inner wall of each via hole is the same as a thickness of the stress buffer layer at the edge region of the opening of each via hole.

Optionally, a thickness of the stress buffer layer at the inner wall of each via hole changes gradually.

Optionally, the flexible display panel further comprises a flexible substrate, wherein the first metal layer is formed on the flexible substrate.

Optionally, the flexible display panel is an OLED display panel provided with a drive circuit layer and an OLED display device.

Optionally, the flexible display panel is a touch display panel which comprises: an OLED display panel provided with a drive circuit layer and an OLED display device; and a touch functional layer disposed on the OLED display panel.

In another aspect, an embodiment of the present disclosure provides a display device, comprising the aforementioned flexible display panel.

In another aspect, an embodiment of the present disclosure provides a method for manufacturing a flexible display panel, comprising:
forming a first metal layer on a flexible substrate;
overlaying the first metal layer with an insulation layer, and forming a plurality of via holes in the insulation layer;
forming a stress buffer layer on an inner wall of each via hole; and
forming a second metal layer on the insulation layer, wherein the second metal layer covers the stress buffer layer in each via hole and is electrically connected to the first metal layer by the via holes.

Optionally, the stress buffer layer also occupies a region on the insulation layer that covers an edge of an opening of each via hole.

Optionally, the stress buffer layer is formed by nanoimprint lithography.

Optionally, said forming the stress buffer layer by nanoimprint lithography comprises:
applying a layer of nanoimprint resist on the insulation layer;
processing the applied nanoimprint resist by nanoimprint lithography such that a thickness of the nanoimprint resist layer at the inner wall of each via hole and a thickness of the nanoimprint resist layer at the edge region of the opening of each via hole are greater than a thickness of the nanoimprint resist layer on other regions; and
removing the nanoimprint resist by ashing from all regions except for the inner wall of each via hole and the edge region of the opening of each via hole.

Optionally, resin material used for the nanoimprint resist comprises one or more of polymethyl methacrylate, acrylic ester, vinyl ether and epoxy resin.

DETAILED DESCRIPTION

To illustrate the objectives, technical solutions and advantages of the embodiments of the present disclosure more clearly, the following describes clearly and completely the technical solutions of the embodiments of the present disclosure with reference to the accompanying drawings of the embodiments. It is obvious that the embodiments described are merely some embodiments of the present disclosure. Any other embodiment obtained on the basis of the described embodiments of the present disclosure by persons of ordinary skill in the art shall fall within the scope of the present disclosure.

In view of the problems in the related art, that is, while the display panel is bended, the insulation layer between the upper and lower metal layers tends to fracture such that the stress-concentration-induced crack propagates to the metal layers which leads to the breakage of the metal layers, giving rise to defective display product, the embodiment of the present disclosure provides a flexible display panel, a manufacturing method thereof and a display device, which are capable of reduce the defective product problem in the related art resulted from the stress propagated to the metal layers when the insulation layer fractures during bending.

Figure 1:
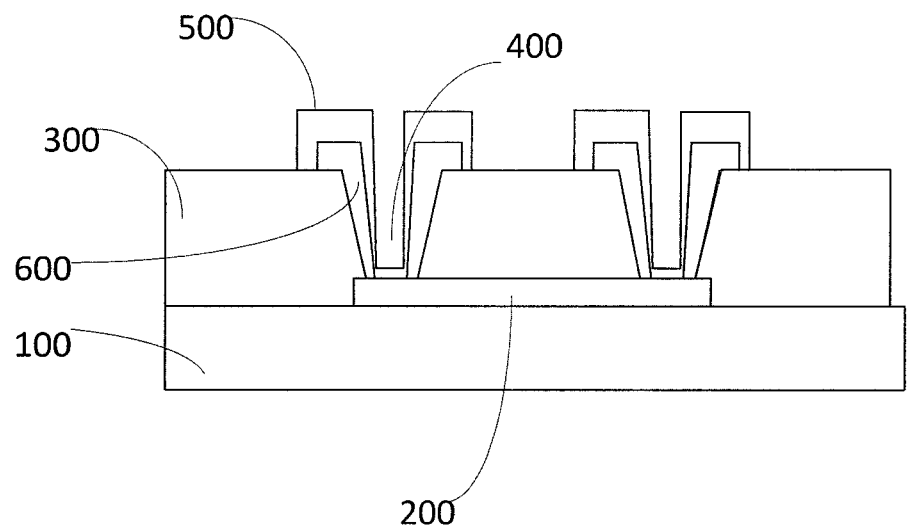
FIG. 1 illustrates a structural schematic diagram of a flexible display panel provided by an embodiment of the present disclosure.

As shown in FIG. 1, a flexible display panel provided by an embodiment of the present disclosure comprises:

a flexible substrate 100;

a first metal layer 200 formed on the substrate 100;

an insulation layer 300 overlying the first metal layer 200, wherein the insulation layer 300 is provided with via holes 400;

a second metal layer 500 disposed on the insulation layer 300;

each via hole 400 comprises a first end and an opposite second end, and an inner wall between the first and second ends, wherein the second end is on a side of the insulation layer 300 that is close to the first metal layer 200 and an opening at the second end exposes the first metal layer 200, and the first end is on a side of the insulation layer 300 that is close to the second metal layer 500;

wherein the inner wall of the via hole 400 and an edge of an opening at the first end of the via hole 400 are covered by a stress buffer layer 600, and the second metal layer 500 overlies the stress buffer layer 600 and electrically connected to the first metal layer 200 through the opening at the second end.

According to the embodiment of the present disclosure, by disposing a via hole 400 in the insulation layer 300 between the upper and lower metal layers, overlaying a stress buffer layer 600 on the inner wall of the via hole 400 and the edge region of the opening of the via hole 400, overlaying the upper metal layer (i.e., the second metal layer 500) on the stress buffer layer 600, and electrically connecting the upper metal layer to the lower metal layer (i.e., the first metal layer 200) by the via hole 400, when the display panel is being bent, thanks to the stress buffer layer 600, the stress-concentration-induced crack in the insulation layer 300 can be effectively prevented from propagating to the metal layers and the stress buffer layer 600 is capable of stress relief, thereby improving the bending yield.

Further, in an practical process, said overlaying the stress buffer layer 600 on the inner wall of the via hole 400 and the edge region of the opening of the via hole 400 may include overlaying the stress buffer layer 600 on the inner wall of the via hole 400 only, or overlaying the stress buffer layer 600 on both the inner wall of the via hole 400 and the edge region of the opening at the upper end (i.e., said first end) of the via hole. The edge region of the opening at the upper end of the via hole refers to a region on the insulation layer 300 that extends outwardly from the edge of the via opening (i.e., a borderline of the opening) to an extent; to overlay the stress buffer layer 600 on the edge facilitates the elimination of stress build-up at the edge region of the opening of the via hole, thus improving the bending yield further.

It is noted, the flexible display panel provided by the embodiment of the present disclosure may be an OLED display panel (i.e., BP) provided with a drive circuit layer and an OLED display device; or a touch display panel comprising a BP and a touch functional layer; and the first metal layer 200 and the second metal layer 500 may be any two metal layers disposed on the flexible display panel that make electrical connection with each other by means of the via hole 400 in the insulation layer 300, e.g., the first metal layer 200 may be an electrode metal layer, and the second metal layer 500 may be a signal line metal layer, etc.

It is also noted, the insulation layer 300 in the aforementioned solution refers to all layers between the first metal layer 200 and the second metal layer 500, e.g., the insulation layer 300 may comprise an interlayer dielectric layer only, or the insulation layer 300 may comprise other layers in addition to the interlayer dielectric layer; and the insulation layer 300 may comprise an inorganic dielectric layer or a stack of various inorganic material layers and organic material layers.

In the flexible display panel provided according to the embodiment of the present disclosure, the stress buffer layer 600 is particularly suitable for disposing on an inorganic insulation layer, to prevent the crack in the inorganic insulation layer from propagating to the metal layer during the bending of the flexible display panel.

Further, in the embodiment provided in the present disclosure, the stress buffer layer 600 may be a resin layer made of resin material. According to aforementioned solution, the stress buffer layer 600 is made of a resin material which is elastic and capable of stress absorption and relief, thus effectively blocking the propagation of the stress-concentration-induced crack in the insulation layer 300 to the upper metal layer (i.e., the second metal layer 500) overlying the stress buffer layer 600. It is to be understood, the stress buffer layer 600 can be made of other material in practice, as long as the stress buffer layer 600 comprises a material capable of stress absorption and relief.

Optionally, the resin material from which the resin layer is made comprises one or more of polymethyl methacrylate, acrylic ester, vinyl ether and epoxy resin. It is certainly understood, the foregoing resin materials utilized in the resin layer are given solely for the purpose of exemplification, and in practice, the material of the resin layer is not limited thereto.

Further, in the embodiment provided in the present disclosure, the stress buffer layer 600 is preferably on the order of nanometers in thickness. In this way, a thin stress buffer layer 600 can be provided, with a precision on the order of nanometers, on the inner wall and the edge region of the opening at the first end of the via hole 400 in the insulation layer 300, thus acting as a stress absorption and relief layer while making no impact to the overall thickness of the display panel. Moreover, the stress buffer layer 600 is preferably 5-10 nm in thickness. It is certainly understood, the display panel according to the embodiment of the present disclosure is not limited thereto.

Further, in the flexible display panel provided according to the embodiment of the present disclosure, the stress buffer layer 600 is a nanoimprinted buffer layer formed on the inner wall and the edge region of the opening at the first end of the via hole 400 by nanoimprint lithography.

According to aforementioned solution, the stress buffer layer is a nanoimprinted buffer layer formed by nanoimprint lithography. Since the the nanoimprint lithography can be performed with a nanoimprint mold, a thin stress buffer layer can be provided, with a precision on the order of nanometers, on the inner wall and the edge region of the opening at the first end of the via hole, thus the precision of the layer thickness, e.g., the overall thickness or local thickness of the stress buffer layer, can be controlled easily, and the form accuracy of the stress buffer layer can be controlled easily as well.

It is understood, in practice, the stress buffer layer can be formed by other processes, e.g., by a photolithography, etc. However, compared with the nanoimprint lithography, the photolithography, if used in forming the stress buffer layer, suffers from a difficult and complex process and an uncontrollable precision.

Further, in the flexible display panel provided according to the embodiment of the present disclosure, a thickness of the stress buffer layer 600 at the inner wall of the via hole 400 is the same as a thickness of the stress buffer layer 600 at the edge region of the opening at the first end of the via hole 400.

According to some embodiments of the present disclosure, a thickness of the stress buffer layer 600 at the inner wall of the via hole 400 is the same as a thickness of the stress buffer layer 600 at the edge region of the opening at the first end of the via hole 400. That is, the stress buffer layer 600 is uniform in thickness. As a result, having been disposed on the via hole 400, the stress buffer layer 600 has a profile in consistent with the via hole 400, which facilitates the fabrication of the second metal layer 500, e.g., the inner wall of the via hole is generally formed with a slope in related art, and if the thickness of the stress buffer layer is uniform, the portion of the stress buffer layer that corresponding to the inner wall of the via hole would have a slope as well, which is beneficial to the fabrication of the second metal layer 500 on the stress buffer layer 600 as far as the production process of the second metal layer is concerned.

It is certainly understood, in practice, the thicknesses of the stress buffer layer 600 at the inner wall of the via hole and at the edge region of the opening at the first end of the via hole can rather be adjusted according to actual structure of the product. For example, a thickness of the stress buffer layer 600 at the inner wall of the via hole is less than a thickness of the stress buffer layer 600 at the edge region of the opening at the first end of the via hole, in this way, the thickness of the stress buffer layer covering the inner wall of the via hole can be decreased adaptively if the via hole is small in size. Alternatively, the thickness of the stress buffer layer 600 at the inner wall of the via hole decreases gradually or increases gradually from the first end to the second end of the via hole, so that a slope angle of the stress buffer layer 600 at the inner wall of the via hole can be adjusted according to actual requirement, thus further facilitating the fabrication of the second metal layer 500.

Further, the flexible display panel provided according to the embodiment of the present disclosure may be an OLED display panel (i.e., BP) provided with a drive circuit layer and an OLED display device; or a touch display panel comprising a BP and a touch functional layer disposed on the BP.

Exemplary embodiments of the flexible display panel provided by the present disclosure are described hereinafter.

Figure 6:
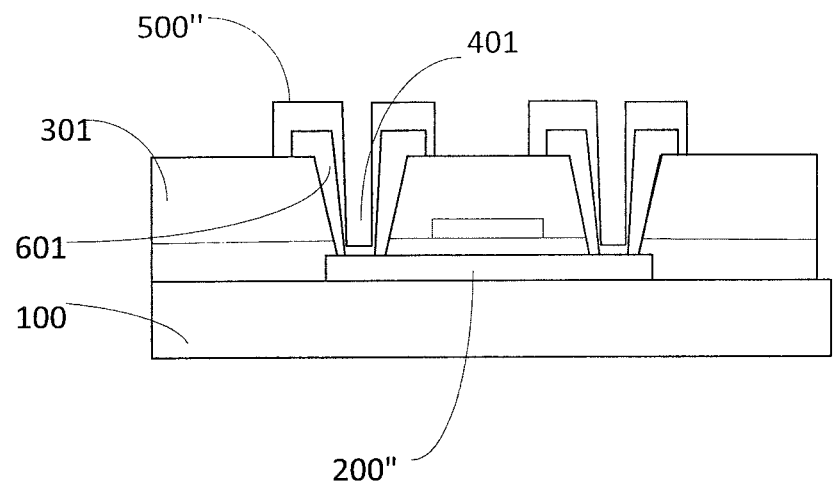
FIG. 6 illustrates a structural schematic diagram of a first embodiment of the flexible display panel provided by the present disclosure.

As shown in FIG. 6, in the first embodiment, the flexible display panel is a BP, comprising:
a flexible substrate 100;
a first metal layer 200" formed on the substrate 100;
a first inorganic insulation layer 301 overlying the first metal layer 200", wherein the first inorganic insulation layer 301 is provided with a first via hole 401, the first via hole 401 comprises a first end and an opposite second end, and an inner wall between the first and second ends, wherein the second end is on a side of the first inorganic insulation layer 301 that is close to the first metal layer 200" and an opening at the second end exposes the first metal layer 200", and the first end is on a side of the first inorganic insulation layer 301 that is distal to the first metal layer 200";
a first stress buffer layer 601 covering the inner wall of the first via hole 401 and an edge of an opening at the first end of the first via hole 401;
a second metal layer 500" overlying the first stress buffer layer 601 and electrically connected to the first metal layer 200" through the opening at the second end.

It is noted, in the aforementioned embodiment, the BP comprises a substrate 100, and the first metal layer 200" and the second metal layer 500" are metal layers of the drive circuit layer or OLED display device in the process of BP production, e.g., a SD metal layer (source, drain metal layers), a drive electrode layer and the like.

In addition, in order to facilitate understanding, in the present embodiment, the insulation layer 300 is represented by the first inorganic insulation layer 301, the via hole 400 is represented by the first via hole 401, and the stress buffer layer 600 is represented by the first stress buffer layer 601.

Figure 7:
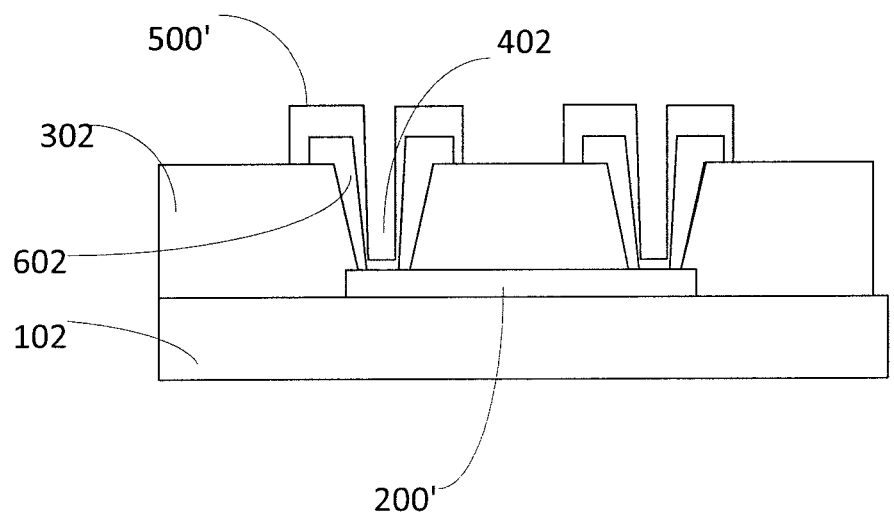
FIG. 7 illustrates a structural schematic diagram of a second embodiment of the flexible display panel provided by the present disclosure.

As shown in FIG. 7, in the second embodiment, the flexible display panel is a touch display panel, comprising:
an OLED display panel (BP) provided with a drive circuit layer and an OLED display device;
a second inorganic insulation layer 102 disposed on the BP;
a first metal layer 200' disposed on the second inorganic insulation layer 102;
a third inorganic insulation layer 302 overlying the first metal layer 200', wherein the third inorganic insulation layer 302 is provided with a second via hole 402, the second via hole 402 comprises a first end and an opposite second end, and an inner wall between the first and second ends, wherein the second end is on a side of the third inorganic insulation layer 302 that is close to the first metal layer 200' and an opening at the second end exposes the first metal layer 200', and the first end is on a side of the third inorganic insulation layer 302 that is distal to the first metal layer 200';
a second stress buffer layer 602 covering the inner wall of the second via hole 402 and an edge of an opening at the first end of the second via hole 402;
a second metal layer 500' overlying the second stress buffer layer 602 and electrically connected to the first metal layer 200' through the opening at the second end of the second via hole 402.

It is noted, in the aforementioned embodiment, the first metal layer 200' and the second metal layer 500' are Multi-layers on cell (MLOC) structure fabricated on the BP following the vapor deposition on the BP, to implement the touch function, for example, the first metal layer and the second metal layer in the present embodiment may be a second capacitive electrode layer, a signal line layer and the like; wherein, in order to facilitate understanding, in the present embodiment, the insulation layer 300 is represented by the third inorganic insulation layer 302, the via hole 400 is represented by the second via hole 402, and the stress buffer layer 600 is represented by the second stress buffer layer 602.

Further, it is understood, the first metal layer in the present embodiment refers to a different metal layer from the first metal layer in the first embodiment, and the second metal layer in the present embodiment refers to a different metal layer from the second metal layer in the first embodiment.

In order to facilitate understanding, the first metal layer and the second metal layer in the accompanying drawings of the first and second embodiments are labeled differently.

Further, in the touch display panel of the present embodiment, the BP may be the BP of the first embodiment, or a BP of other structure.

Further, a flexible display panel provided by the embodiment of the present disclosure may be all kinds of flexible panels, e.g. the OLED display panel, or other types of flexible display panels, such as AMOLED display panel and Quantum Dot Light Emitting Diodes (QLED) display panel.

Further, an embodiment of the present disclosure provides a display device, which comprises the flexible display panel provided by the embodiment of the present disclosure.

Further, an embodiment of the present disclosure provides a method for manufacturing a flexible display panel. The method is applicable to the production of the flexible display panel provided by the embodiment of the present disclosure and comprises:

Step S1, forming a first metal layer 200 on a flexible substrate 100;

Step S2, overlaying the first metal layer 200 with an insulation layer 300, and opening at least one via hole 400 in the insulation layer 300, the via hole 400 comprises a first end and an opposite second end, and an inner wall between the first and second ends, wherein the second end is on a side of the insulation layer 300 that is close to the first metal layer 200 and an opening at the second end exposes the first metal layer 200, and the first end is on a side of the insulation layer 300 that is close to the second metal layer 500;

Step S3, forming a stress buffer layer 600 on an inner wall of the via hole 400; and Step S4, overlaying the stress buffer layer 600 and the insulation layer 300 with a second metal layer 500, wherein the second metal layer 500 is electrically connected to the first metal layer 200 through the opening at the second end.

According to some embodiments of the present disclosure, the step S3 further comprises forming the stress buffer layer 600 on an edge of an opening at the first end of the via hole 400.

According to the embodiment of the present disclosure, by disposing the via hole 400 in the insulation layer 300 between upper and lower metal layers, overlaying the stress buffer layer 600 on the inner wall of the via hole 400 and the edge region of the opening of the via hole 400, overlaying the upper metal layer (the second metal layer 500) on the stress buffer layer 600, and electrically connecting the upper metal layer to the lower metal layer (the first metal layer 200) by the via hole 400, when the flexible display panel is being bent, thanks to the stress buffer layer 600, the stress-concentration-induced crack in the insualtion layer 300 can be effectively prevented from propagating to the metal layers and the stress buffer layer 600 is capable of stress relief, thereby improving the bending yield.

It is noted, the flexible display panel provided by the embodiment of the present disclosure may be an OLED display panel (i.e., BP) provided with a drive circuit layer and an OLED display device; or a touch display panel comprising a BP and a touch functional layer; and the first metal layer 200 and the second metal layer 500 may be any two metal layers disposed on the flexible display panel that make electrical connection with each other by means of the via hole 400 in the insulation layer 300, e.g., the first metal layer 200 may be an electrode metal layer, and the second metal layer 500 may be a signal line metal layer, etc.

It is also noted, the insulation layer 300 in the aforementioned solution refers to all layers between the first metal layer 200 and the second metal layer 500, e.g., the insulation layer 300 may comprise an interlayer dielectric layer only, or the insulation layer 300 may comprise other layers in addition to the interlayer dielectric layer; moreover, in the display panel provided by the present disclosure, the display panel may in particular be a flexible display panel, and the stress buffer layer 600 is particularly suitable for disposing on an inorganic insulation layer 300, to prevent the breaking stress in the inorganic insulation layer 300 from propagating to the metal layer during the bending of the flexible display panel.

In the method provided by the present disclosure, the step S4 optionally comprises:

forming the stress buffer layer 600 on the inner wall of the via hole 400 and the edge region of the opening at the first end of the via hole 400 by nanoimprint lithography.

In the aforementioned solution, the stress buffer layer 600 may be fabricated by nanoimprint lithography and the stress buffer layer 600 is on the order of nanometers in thickness. In this way, a thin stress buffer layer 600 can be provided, with a precision on the order of nanometers, on the inner wall and the edge region of the opening at the first end of the via hole 400 in the insulation layer 300, thus acting as a stress absorption and relief layer while making no impact to the overall thickness of the flexible display panel. Moreover, the stress buffer layer 600 is preferably 5-10 nm in thickness.

Optionally, said forming the stress buffer layer 600 on the inner wall of the via hole 400 and the edge region of the opening at the first end of the via hole 400 by nanoimprint lithography comprises:

Step S41, applying a layer of nanoimprint resist on the insulation layer 300;

Step S42, processing the applied nanoimprint resist by nanoimprint lithography such that a thickness of the nanoimprint resist layer at the inner wall of the via hole 400 and a thickness of the nanoimprint resist layer at the edge region of the opening at the first end of the via hole 400 are greater than a thickness of the nanoimprint resist layer elsewhere; and Step S43, removing the nanoimprint resist by ashing from all regions except for the inner wall of the via hole 400 and the edge region of the opening at the first end of the via hole 400, to form the stress buffer layer 600.

According to aforementioned solution, to produce the flexible display panel comprises: first, forming the first metal layer 200 on the substrate 100; next, overlaying the first metal layer 200 with the insulation layer 300 and forming the via hole 400 in the insulation layer 300 by processes such as exposure, development and hole etching; next, applying a layer of nanoimprint resist on the insulation layer 300; next, performing a nanoimprint lithography process (preferably, with a precision of 5-10 nm) such that the thickness of the nanoimprint resist in the region where the nanoimprint resist will remain subsequently (i.e., the inner wall of the via hole 400 and the edge region of the opening at the first end of the via hole 400) is greater than the thickness of the nanoimprint resist in the region where the nanoimprint resist will be removed subsequently (i.e., regions other than the inner wall of the via hole 400 and the edge region of the opening at the first end of the via hole 400), in another word, the thickness of the nanoimprint resist at the inner wall of the via hole 400 and the edge region of the opening at the first end of the via hole 400 is relatively thicker, while the region where the nanoimprint resist will be removed subsequently (such as the bottom of the via hole 400, other regions in the periphery of the opening at the second end of the via hole 400) has a very thin layer of nanoimprint resist; next, performing ashing to remove the nanoimprint resist in the region where the nanoimprint resist is not required, thereby the nanoimprint resist at the inner wall of the via hole 400 and the edge region of the opening at the first end of the via hole 400 remains to form the stress buffer layer 600; subsequently, forming the second metal layer 500.

It is noted, in the foregoing step S42 and step S43, since the nanoimprint lithography is performed with a nanoimprint mold and the nanoimprint mold would be damaged if the mold comes into direct contact with the insulation layer 300 underneath the nanoimprint resist, the nanoimprint resist in the region where the nanoimprint resist is not required later can not be removed directly by the mold, instead, during the imprinting a thin layer of resist is left in the region where the nanoimprint resist is not required later and the nanoimprint resist is thinned as a whole by a subsequent ashing process. Since the thickness of the nanoimprint resist in the region where the nanoimprint resist is not required later is less than the thickness of the nanoimprint resist in the region where the nanoimprint resist is required later, a overall thinning of the resist by ashing would remove the nanoimprint resist in the region where the nanoimprint resist is not required later, thereby finally forming the stress buffer layer 600.

Further, in the aforementioned solution, the nanoimprint resist from which the stress buffer layer 600 is formed may be made of resin material, such as one or more of polymethyl methacrylate, acrylic ester, vinyl ether and epoxy resin. It is certainly understood, the foregoing resin materials utilized in the nanoimprint resist are given solely for the purpose of exemplification, and in practice, the material of the nanoimprint resist is not limited thereto.

To provide a more detailed description of the present disclosure, the method for manufacturing the flexible display panel provided in the first embodiment of the disclosure and the method for manufacturing the flexible display panel provided in the second embodiment of the disclosure are described in detail hereinafter.

Firstly, a detailed method for manufacturing the flexible display panel provided in the first embodiment is illustrated.

Figure 2:
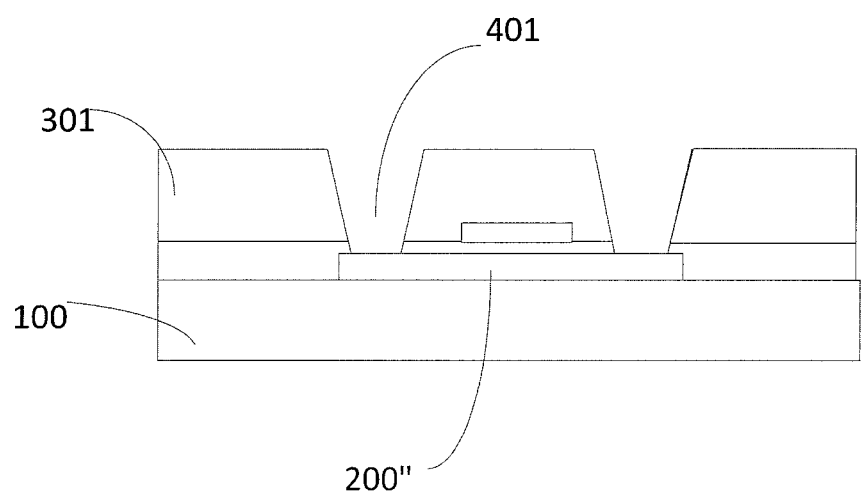
FIG. 2 illustrates a schematic diagram of a step of forming an insulation layer on a substrate according to a method provided by an embodiment of the present disclosure.
Figure 3:
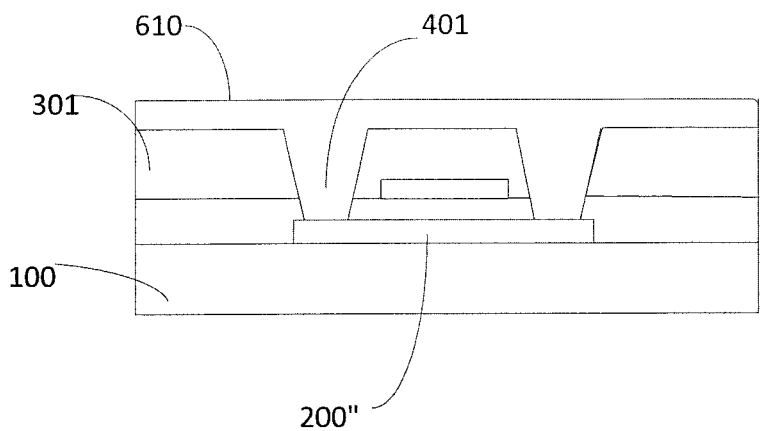
FIG. 3 illustrates a schematic diagram of a step of applying a layer of nanoimprint resist following the step of FIG. 2.
Figure 4:
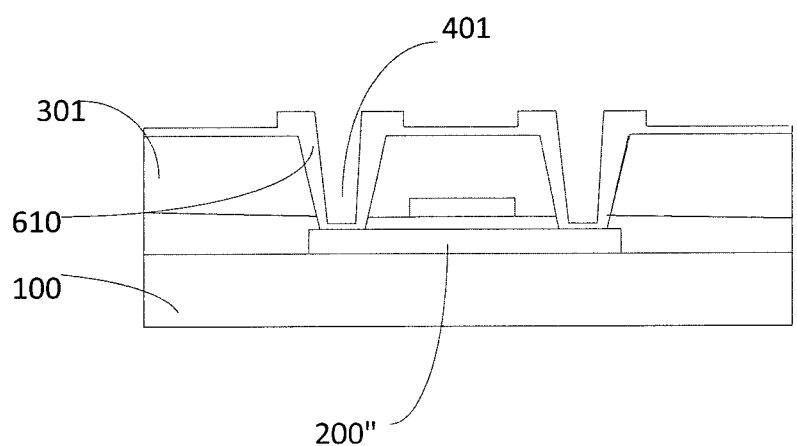
FIG. 4 illustrates a schematic diagram of a step of performing nanoimprint lithography following the step of FIG. 3.
Figure 5:
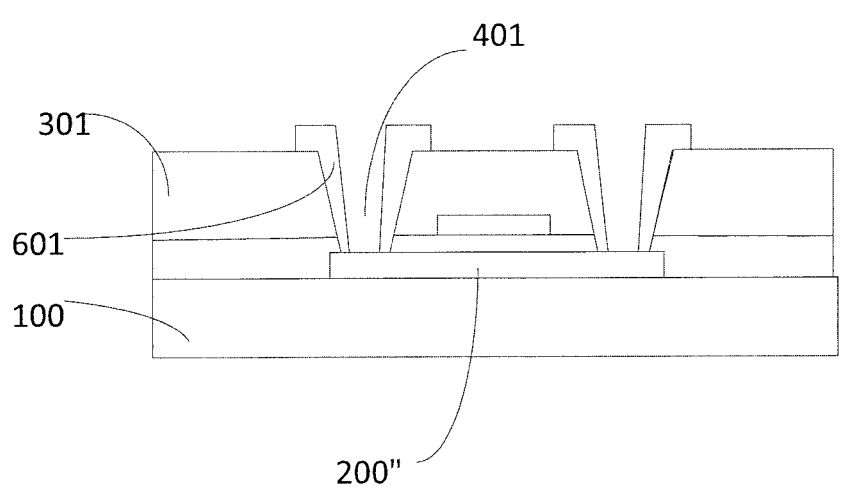
FIG. 5 illustrates a schematic diagram of a ashing step following the step of FIG. 4.

The flexible display panel is BP, the manufacturing process thereof comprises:

First, producing a BP by means of conventional processes, till the via hole 400 is formed in the ILD (interlayer dielectric layer 300), that is, as shown in FIG. 2, the first metal layer 200" and the first inorganic insulation layer 301 are formed on the substrate 100 and the first via hole 401 is provided in the first inorganic insulation layer 301;

Next, as shown in FIG. 3, applying a layer of nanoimprint resist 610 on the first inorganic insulation layer 301;

Next, as shown in FIG. 4, performing a nanoimprint lithography process with a nanoimprint mold such that the thickness of the nanoimprint resist 610 in the region where the nanoimprint resist will remain subsequently (i.e., the inner wall of the first via hole 401 and the edge region of the opening at the first end of the first via hole 401) is greater than the thickness of the nanoimprint resist 610 in the region where the nanoimprint resist is not required subsequently (i.e., regions other than the inner wall of the first via hole 401 and the edge region of the opening at the first end of the first via hole 401), in another word, the thickness of the nanoimprint resist at the inner wall of the first via hole 401 and the edge region of the opening at the first end of the first via hole 401 is relatively thicker, while the region where the nanoimprint resist will be removed subsequently (such as the bottom of the first via hole 401, other regions in the periphery of the opening at the second end of the first via hole 401) has a very thin layer of nanoimprint resist;

Next, as shown in FIG. 5, performing ashing to remove the nanoimprint resist 610 in the region where the nanoimprint resist is not required, thereby the nanoimprint resist at the inner wall of the first via hole 401 and the edge region of the opening at the first end of the first via hole 401 remains to form the first stress buffer layer 601;

subsequently, as shown in FIG. 6, forming the second metal layer 500" (such as a SD metal layer).

Secondly, a detailed method for manufacturing the flexible display panel provided in the second embodiment is illustrated.

The flexible display panel is a touch display panel, and the method is processes for fabricating Multi-layers on cell (MLOC) structure enabling the touch function on the touch display panel following the vapor deposition on the BP, comprising:

First, forming the second inorganic insulation layer 102 on the BP;

Next, forming the first metal layer 200 on the second inorganic insulation layer 102;

Next, overlaying the first metal layer 200 with the third inorganic insulation layer 302 and forming the second via hole 402 in the third inorganic insulation layer 302 by etching;

Next, performing a nanoimprint lithography process with a nanoimprint mold such that the thickness of the nanoimprint resist 610 in the region where the nanoimprint resist will remain subsequently (i.e., the inner wall of the second via hole 402 and the edge region of the opening at the first end of the second via hole 402) is greater than the thickness of the nanoimprint resist 610 in the region where the nanoimprint resist is not required subsequently (i.e., regions other than the inner wall of the second via hole 402 and the edge region of the opening at the first end of the second via hole 402), in another word, the thickness of the nanoimprint resist at the inner wall of the second via hole 402 and the edge region of the opening at the first end of the second via hole 402 is relatively thicker, while the region where the nanoimprint resist will be removed subsequently (such as the bottom of the second via hole 402, other regions in the periphery of the opening at the second end of the second via hole 402) has a very thin layer of nanoimprint resist;

Next, performing ashing to remove the nanoimprint resist in the region where the nanoimprint resist is not required, thereby the nanoimprint resist at the inner wall of the second via hole 402 and the edge region of the opening at the first end of the second via hole 402 remains to form the stress buffer layer 600;

subsequently, forming the second metal layer 500 (such as a SD metal layer).

The above descriptions merely describe preferred embodiments of this disclosure. It should be appreciated that modifications and replacements may be made in the embodiments by persons skilled in the art without departing from the principle of the present disclosure, and these modifications and replacements shall fall within the scope of the present disclosure.

What is claimed is:

1. A flexible display panel, comprising:
a first metal layer;
an insulation layer overlying the first metal layer; and
a second metal layer disposed on the insulation layer,
wherein, a plurality of via holes are provided in the insulation layer, an inner wall of each of the plurality of via holes is covered by a stress buffer layer, and the second metal layer is formed on the stress buffer layer and electrically connected to the first metal layer by the via holes,
the stress buffer layer is made of a resin material.

2. The flexible display panel according to claim 1, wherein the stress buffer layer also occupies a region on the insulation layer that covers an edge of an opening of each via hole.

3. The flexible display panel according to claim 2, wherein
a thickness of the stress buffer layer at the inner wall of each via hole is the same as a thickness of the stress buffer layer at the edge region of the opening of each via hole.

4. The flexible display panel according to claim 1, wherein
the resin material comprises at least one of polymethyl methacrylate, acrylic ester, vinyl ether and epoxy resin.

5. The flexible display panel according to claim 4, wherein
the stress buffer layer has a thickness ranging from 5 nm to 10 nm.

6. The flexible display panel according to claim 1, wherein
the stress buffer layer is a nanoimprinted buffer layer formed by nanoimprint lithography.

7. The flexible display panel according to claim 1, wherein a thickness of the stress buffer layer at the inner wall of each via hole changes gradually.

8. The flexible display panel according to claim 1, further comprising a flexible substrate, wherein the first metal layer is formed on the flexible substrate.

9. The flexible display panel according to claim 1, wherein the flexible display panel is an OLED display panel provided with a drive circuit layer and an OLED display device.

10. The flexible display panel according to claim 1, wherein the flexible display panel is a touch display panel which comprises: an OLED display panel provided with a drive circuit layer and an OLED display device; and a touch functional layer disposed on the OLED display panel.

11. A display device, comprising a flexible display panel, wherein the flexible display panel comprises:
a first metal layer;
an insulation layer overlying the first metal layer; and
a second metal layer disposed on the insulation layer,
wherein, a plurality of via holes are provided in the insulation layer, an inner wall of each of the plurality of via holes is covered by a stress buffer layer, and the second metal layer is formed on the stress buffer layer and electrically connected to the first metal layer by the via holes.

12. A method for manufacturing a flexible display panel, comprising:
forming a first metal layer on a flexible substrate;
overlaying the first metal layer with an insulation layer; and
disposing a second metal layer on the insulation layer,
wherein a plurality of via holes are provided in the insulation layer, an inner wall of each of the plurality of via holes is covered by a stress buffer layer, and the second metal layer is formed on the stress buffer layer and electrically connected to the first metal layer by the via holes.

13. The method according to claim 12, wherein the stress buffer layer also occupies a region on the insulation layer that covers an edge region of an opening of each via hole.

14. The method according to claim 13, comprising forming the stress buffer layer by nanoimprint lithography.

15. The method according to claim 14, wherein said forming the stress buffer layer by nanoimprint lithography comprises:
applying a layer of nanoimprint resist on the insulation layer;
processing the applied nanoimprint resist by nanoimprint lithography such that a thickness of the nanoimprint resist layer at the inner wall of each via hole and a thickness of the nanoimprint resist layer at the edge region of the opening of each via hole are greater than a thickness of the nanoimprint resist layer on other regions; and
removing the nanoimprint resist by ashing from all regions except for the inner wall of each via hole and the edge region of the opening of each via hole.

16. The method according to claim 15, wherein
the resin material used for the nanoimprint resist comprises one or more of polymethyl methacrylate, acrylic ester, vinyl ether and epoxy resin.

* * * * *